US008930782B2

(12) United States Patent
Benware (10) Patent No.: US 8,930,782 B2
(45) Date of Patent: Jan. 6, 2015

(54) ROOT CAUSE DISTRIBUTION DETERMINATION BASED ON LAYOUT AWARE SCAN DIAGNOSIS RESULTS

(75) Inventor: Robert Brady Benware, Clackamas, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 440 days.

(21) Appl. No.: 13/473,549

(22) Filed: May 16, 2012

(65) Prior Publication Data

US 2012/0297264 A1 Nov. 22, 2012

Related U.S. Application Data

(60) Provisional application No. 61/486,654, filed on May 16, 2011.

(51) Int. Cl.
*G06F 11/00* (2006.01)
*G01R 31/28* (2006.01)
(Continued)

(52) U.S. Cl.
CPC *G01R 31/318544* (2013.01); *G01R 31/318307* (2013.01); *G01R 31/3183* (2013.01); *G01R 31/2836* (2013.01); *H01L 22/30* (2013.01); *H01L 22/12* (2013.01); *G01R 31/318511* (2013.01); *H01L 2027/11864* (2013.01); *G01R 31/318342* (2013.01); *G06F 17/5068* (2013.01); *H01L 2027/11874* (2013.01); *G06F 17/5081* (2013.01); *H01L 2924/37001* (2013.01); *H01L 22/14* (2013.01); *H01L 22/20* (2013.01)
USPC ............... 714/724; 714/25; 714/44; 714/726; 714/729; 714/734; 714/738; 714/742; 716/52; 716/112; 716/119; 716/136; 702/59; 702/117; 702/118; 702/124; 382/149

(58) Field of Classification Search
CPC ........... G01R 31/2836; G01R 31/3183; G01R 31/318544; G01R 31/318307; G01R 31/318342; G01R 31/318511; H01L 22/00; H01L 22/12; H01L 22/30; H01L 2027/11864; H01L 2924/37001; H01L 2027/11874; G06F 17/5068; G06F 17/5081
USPC ............. 714/25, 44, 724, 726, 729, 734, 738, 714/742; 716/52, 112, 119, 136; 702/59, 702/117, 118, 124; 382/149
See application file for complete search history.

(56) References Cited

U.S. PATENT DOCUMENTS

| 6,185,707 | B1 * | 2/2001 | Smith et al. .................... 714/724 |
| 7,570,796 | B2 * | 8/2009 | Zafar et al. .................... 382/144 |

(Continued)

OTHER PUBLICATIONS

Liu et al., Layout-Aware Pseudo-Functional Testing for Critical Paths Considering Power Supply Noise Effects, Mar. 8, 2010, IEEE, pp. 1-6.*

(Continued)

*Primary Examiner* — John J Tabone, Jr.

(57) ABSTRACT

Aspects of the invention relate to yield analysis techniques for generating root cause distribution information. Suspect information for a plurality of failing dies is first generated using a layout-aware diagnosis method. Based on the suspect information, potential root causes for the plurality of failing dies, and suspect feature weights and total feature weights for each of the potential root causes may then be determined. Next, the probability information of observing a particular suspect that is related to a particular root cause may be extracted. Finally, an expectation-maximization analysis may be conducted for generating the root cause distribution information based on the probability information and the suspect information. Heuristic information may be used to prevent the analysis from over-fitting.

14 Claims, 4 Drawing Sheets

(51) Int. Cl.
*G06F 17/50* (2006.01)
*G01R 31/00* (2006.01)
*G06K 9/03* (2006.01)
*G01R 31/3185* (2006.01)
*G01R 31/3183* (2006.01)
*H01L 21/66* (2006.01)
*H01L 27/118* (2006.01)

(56) References Cited

U.S. PATENT DOCUMENTS

| | | | |
|---|---|---|---|
| 7,715,997 B2* | 5/2010 | Long et al. | 702/81 |
| 8,041,103 B2* | 10/2011 | Kulkarni et al. | 382/144 |
| 8,316,265 B2* | 11/2012 | Guo et al. | 714/726 |
| 8,397,113 B2* | 3/2013 | Bartenstein et al. | 714/738 |
| 8,607,169 B2* | 12/2013 | Leu | 716/52 |
| 2006/0053357 A1* | 3/2006 | Rajski et al. | 714/742 |
| 2007/0156379 A1* | 7/2007 | Kulkarni et al. | 703/14 |
| 2007/0288219 A1* | 12/2007 | Zafar et al. | 703/14 |
| 2008/0215943 A1* | 9/2008 | Guo et al. | 714/729 |
| 2009/0055783 A1* | 2/2009 | Florence et al. | 716/4 |
| 2009/0070055 A1* | 3/2009 | Long et al. | 702/81 |
| 2009/0235134 A1* | 9/2009 | Guo et al. | 714/726 |
| 2010/0119144 A1* | 5/2010 | Kulkarni et al. | 382/144 |
| 2011/0184702 A1* | 7/2011 | Sharma et al. | 702/185 |
| 2011/0286656 A1* | 11/2011 | Kulkarni et al. | 382/144 |
| 2012/0089879 A1* | 4/2012 | Bartenstein et al. | 714/738 |
| 2012/0216088 A1* | 8/2012 | Guo et al. | 714/726 |
| 2013/0024830 A1* | 1/2013 | Tang et al. | 716/112 |
| 2013/0080849 A1* | 3/2013 | Guo et al. | 714/726 |
| 2014/0059511 A1* | 2/2014 | Benware et al. | 716/136 |

OTHER PUBLICATIONS

Keim et al., A Rapid Yield Learning Flow Based on Production Integrated Layout-Aware Diagnosis, 2006, IEEE, pp. 1-10.*

Erb et al., Yield Enhancement Through Fast Statistical Scan Test Analysis for Digital Logic, Apr. 2005, IEEE, pp. 1-6.*

C. Hora, R. Segers, S. Eichenberger, and M. Lousberg, "An effective diagnosis method to support yield improvement", Proc. Int'l Test Conf., 2002.

D. Chieppi, G. De Nicolao, P. Amato, D. Appelo and K. Giarda, "E A new statistical algorithm to enhance volume diagnostic effectiveness and accuracy", IEEE Silicon Debug and Diagnosis Workshop, 2006.

Huaxing Tang, Manish SHarma, Janusuz Rajksi, Martin Keim and Brady Benware, "Analyzing Volume Diagnosis Results with Statistical Learning for Yield Improvement", Proc. of European Test Symposium, 2007.

Xiaochun Yu, R.D. Blanton, "Estimating defect-type distributions through volume diagnosis and defect behavior attribution," Proc. Int'l Test Conf., 2010.

M. Sharma, B. Benware, Lei Ling, D. Abercrombie, L. Lee, M. Keim, H. Tang, Wu-Tung Cheng, Ting-Pu Tai, Yu-Jung Chang, R. Lin, and A. Man, "Efficiently Performing Yield Enhancements by Identifying Dominant Physical Root Cause from Test Fail Data", Proc. Int'l Test Conf., 2008.

Li-C. Wang, Pouria Bastani, and Magdy S. Abadir, "Design-silicon timing correlation: a data mining perspective," Proc. of the 44th annual Design Automation Conference, 2007.

Tam Wing Chiu, O. Poku, R.D. Blanton, "Systematic defect identification through layout snippet clustering," Proc. Int'l Test Conference, 2010.

Y-J. Chang, M.-T. Pang, M. Brennan, A. Man, M. Keim, G. Eide, B. Benware and T.-P. Tai, "Experiences with Layout-Aware Diagnosis—A Case Study", Electronic Device Failure Analysis 12(12) (2010), pp. 12-18.

* cited by examiner

Flow chart 400

FIG. 4

ROOT CAUSE DISTRIBUTION DETERMINATION BASED ON LAYOUT AWARE SCAN DIAGNOSIS RESULTS

RELATED APPLICATIONS

This application claims priority to U.S. Provisional Patent Application No. 61/486,654, entitled "Determining a Failure Root Cause Distribution from a Population of Layout Aware Scan Diagnosis Results," filed on May 16, 2011, and naming Robert Brady Benware as an inventor, which application is incorporated entirely herein by reference.

FIELD OF THE INVENTION

The present invention relates to the field of integrated circuit (IC) testing technology. Various implementations of the invention may be particularly useful for yield analysis for IC manufacturing.

BACKGROUND OF THE INVENTION

The yield of an IC is a critical factor for the commercial success of the IC. Achieving high and stable yields helps ensure that products meet quality and reliability objectives and are profitable in the market place. When a new manufacturing process is introduced, or a new product is introduced to a mature manufacturing process, yields tend to be significantly lower than acceptable. The ability to meet profitability and quality objectives, and perhaps more importantly, time-to-market and time-to-volume objectives depend greatly on the rate at which the low yield can be ramped up. The yield ramp process can be speeded up by yield learning or analysis.

Some yield analysis techniques extract information about failure mechanisms causing yield loss from volume scan diagnosis results. Scan diagnosis is a process that can identify specific locations in a design that are likely to explain failing scan test data. Results produced by a scan diagnosis process usually are not definite. The ambiguity is two-fold: First, the scan diagnosis often identifies multiple locations (referred to as suspects hereinafter) for observed defective logical behavior; second, each suspect may be associated with multiple possible root causes.

Statistical methods based on aggregation of raw diagnosis results have been developed to derive the root cause distribution information. These methods can identify root causes associated with bridge defects but do not deal with or have difficulties in dealing with metal open defects. One of the reasons may be the correlation among metal layers and via in the diagnostic callouts. Moreover, many of these yield learning methods employ iterative learning algorithms but could not avoid over-fitting problems. This is of real practical concern as the number of possible root causes can be on the order of hundreds or thousands and in some case significantly outnumber the total number of failing devices being analyzed. Therefore, yield analysis methods that can overcome the above limitations are desirable.

BRIEF SUMMARY OF THE INVENTION

Aspects of the invention relate to yield analysis techniques for generating root cause distribution information. With various implementations of the invention, a layout-aware diagnosis is performed to derive suspect information for a plurality of failing dies. The suspect information comprises a plurality of suspects. The suspects may be arranged into symptoms. Based on the suspect information, potential root causes for the plurality of failing dies, and suspect feature weights and total feature weights for each of the potential root causes may then be determined.

The probability information of observing a particular suspect that is related to a particular root cause may be generated based on the suspect feature weights, the total feature weights, the suspect information and circuit design information. The circuit design information comprises logic and layout information. Finally, root cause distribution information may be generated based on the probability information and the suspect information. An expectation-maximization analysis may be conducted for the generation of root cause distribution information. The performing expectation-maximization analysis may comprise using heuristic information to eliminate one or more potential root causes for solving the over-fitting problem.

DETAILED DESCRIPTION OF THE INVENTION

General Considerations

Various aspects of the present invention relate to yield analysis techniques and more specifically techniques for generating root cause distribution information based on layout aware scan diagnosis results. In the following description, numerous details are set forth for the purpose of explanation. However, one of ordinary skill in the art will realize that the invention may be practiced without the use of these specific details. In other instances, well-known features have not been described in details to avoid obscuring the present invention.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "determine," "generate," and "derive" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

Illustrative Operating Environment

Figure 1:
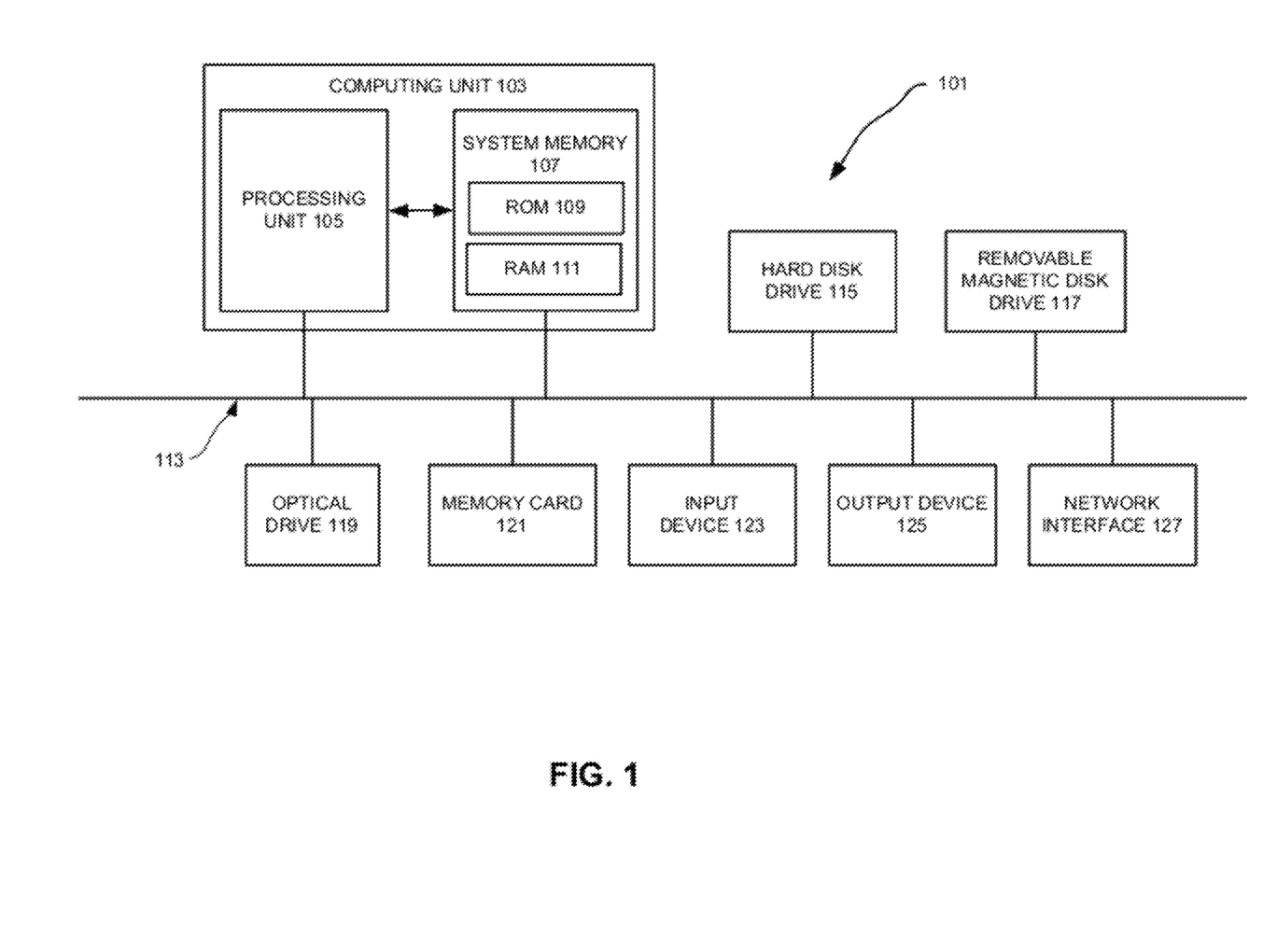
FIG. 1 illustrates a programmable computer system with which various embodiments of the invention may be employed.

Various examples of the invention may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it not intended to be limiting. Various embodiments of the invention may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Diagnosis Suspects and Root Cause Deconvolution

During semiconductor manufacturing processes, IC devices are fabricated on wafers. Each fabricated IC device on a wafer is usually tested before packaging. The testing is usually performed by automated test equipment (ATE). The tested wafer is then cut into rectangular blocks, each of which is called a die. To test a die, the ATE loads test patterns as test stimuli into scan chains that are built in the IC device on the die. Test responses are collected in a failure file if the die does not pass the test. Based on the failure file and the corresponding test patterns, a diagnosis tool may be able to produce information explaining why the die fails. As noted before, the failure file usually reports more than one suspect. Multiple suspects may be arranged into a plurality of symptoms, each symptom corresponding to one defect, and each suspect within that symptom representing a potential location and type for the defect.

Many traditional diagnosis tools use only logic information of a device to generate a list of suspects. Recently physical or layout information has been incorporated into diagnosis processes, such as those described by an article, Y-J. Chang, M.-T. Pang, M. Brennan, A. Man, M. Keim, G. Eide, B. Benware and T.-P. Tai, "Experiences with Layout-Aware Diagnosis—A Case Study", Electronic Device Failure Analysis 12(12) (2010), pp. 12-18, which is incorporated herein by reference. These techniques may be referred to as layout aware diagnosis. Taking advantage of the layout information, the layout aware diagnosis can eliminate physically impossible suspects and reduce defect-bounding box of a suspect to improve diagnosis accuracy and resolution.

Even with the layout aware diagnosis, each suspect in a diagnosis report may still be associated with one or more root causes. For example, an open defect at an input of a logic gate (a suspect) may be associated with open critical area models on several metal layers (root causes). Likewise, a root cause may be associated with several suspects for different dies. For example, a short critical area model for metal layer 4 may be the main cause why dies in a lot fail even though each of the dies may have different combinations of suspects. With implementations of the invention, root cause deconvolution techniques, discussed in detail below, may be used for yield learning/analysis by extracting root cause distribution information from layout aware diagnosis reports for a plurality of dies.

Figure 2:
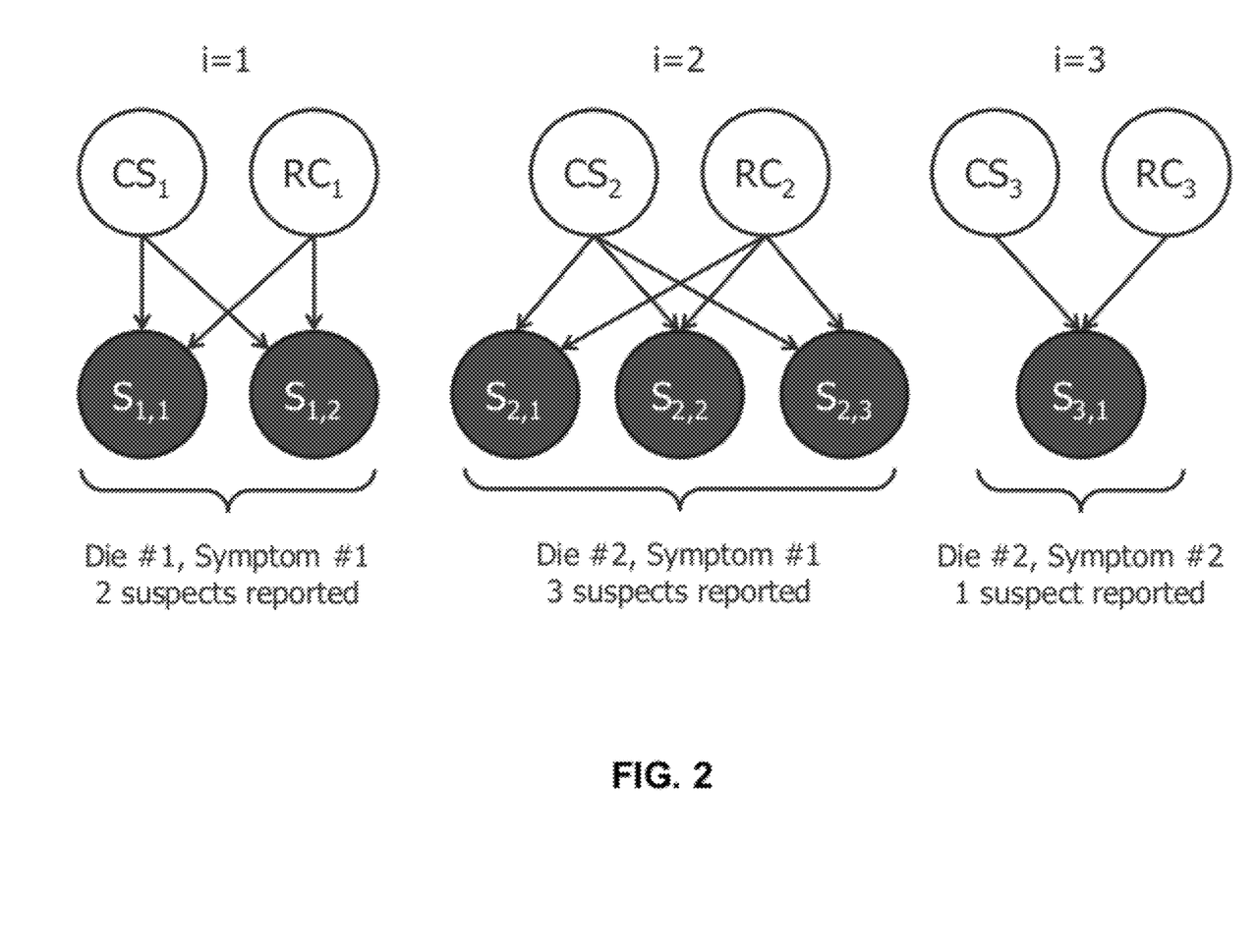
FIG. 2 illustrates an example of using a graphical model (a Bayes net) to represent the relationship between unknown root causes (RC), unknown correct suspects (CS) and observed set of suspects (S).

FIG. 2 illustrates an example of using a graphical model (a Bayes net) to represent the relationship between unknown root causes (RC), unknown correct suspects (CS) and observed set of suspects (S). In the figure, filled circles represent observed random variables whereas empty circles represent hidden (or unobserved) random variables. The root cause of the $i^{th}$ diagnosis symptom, labeled as $RC_i$, is a hidden variable and can take on any value in the list of L valid root causes being considered. The correct suspect of the $i^{th}$ diagnosis symptom, labeled as $CS_i$, is a hidden variable and can take on any value in the list of possible suspects for the $i^{th}$ diagnosis symptom. The observed suspect list of the $i^{th}$ diagnosis symptom, labeled as is an observed variable and has the value of the complete list of suspects in the $i^{th}$ symptom.

The unknown probability distribution of root causes (root cause distribution information), $P(RC_i)$, may be parameterized in the following way:

$$P(RC_i = rc_l) = \frac{\theta_l}{\sum_{m=1}^{L} \theta_m} \quad l = 1 \ldots L \quad [1]$$

where L is the total number of possible root causes under consideration and $\theta_l$ is proportional to the total number of defects in the population of failing devices corresponding to root cause $rc_l$. The vector $\theta$ is the set of parameters of the model that will be produced in a learning process. By definition, $P(RC_1)=P(RC_2)=\ldots=P(RC_l)$, implying there is a single underlying defect distribution (or root cause distribution) for a specified set of failing devices (dies).

The probability for each suspect in the $i^{th}$ symptom that is the correct suspect, $P(CS_i)$, represents the prior knowledge about the likelihood that a suspect may be the correct one. The actual probabilities represented by this prior knowledge will depend greatly on the diagnosis tools that generate the results and may be expressed as:

$$P(CS_i = f(\text{attributes of } cs_{i,k} \text{ and symptom } i) \, k_i = 0 \ldots J_i \quad [2]$$

where $J_i$ is the number of suspects in the $i^{th}$ symptom and $s_{i,k_i}$ is the $k_i^{th}$ suspect in the $i^{th}$ symptom. The special case $s_{i,0}$, corresponds to the scenario in which none of the reported suspects are correct for that symptom. In the event that prior knowledge about the likelihood of each suspect being correct is not known, then an equal probability distribution can be used, representing the lack of good prior knowledge.

The probability of observing a specific suspect as the $j_i^{th}$ suspect in the $i^{th}$ symptom given knowledge of the root cause and knowledge of the correct suspect, is labeled as $P(S_{i,j_i}|RC_i, CS_i)$. This probability can be broken into two different scenarios. In the first scenario, the suspect under consideration is the correct suspect. In this case, the probability of observing a specific suspect may depend on that suspect's susceptibility to the root cause. For example, if the root cause under consideration is a random particle open defect on metal layer two, then the probability of observing a specific suspect will be equal to the suspect's critical area for open defects on metal layer two, divided by the total critical area for all possible suspects.

The second scenario is when the suspect under consideration is not the correct suspect. The model presented herein assumes that the observation of an incorrect suspect is independent of the correct suspect and independent of the root cause. The probability of observing a specific incorrect suspect may therefore be related to how many incorrect suspects there were to choose from. This further assumes that each potential suspect has the same probability of showing up on a diagnosis report. Accordingly, the complete conditional probability can be expressed as:

$$P(S_{i,j_i} = s_{i,j_i} | CS_i = s_{i,k_i}, RC_i = rc_l) \quad [3]$$

$$= \begin{cases} \dfrac{w_{j_i,l}}{W_l} & \text{if } s_{i,j_i} = s_{i,k_i} \\ \dfrac{1}{cnt(\text{suspects of types } s_{i,j_i})} & \text{otherwise} \end{cases}$$

where $w_{j_i,l}$ is the suspect feature weight for root cause l of the $i^{th}$ symptom and $j_i^{th}$ suspect, $W_l$ is the total feature weight for root cause l. For the second condition, suspect type may be one of: cell suspect, bridge suspect or open net segment suspect. Because each suspect type can have a different number of total occurrences in the design, each suspect type may need to be considered separately. The special case as noted above where the correct suspect is not on the diagnosis report may also be handled by this second condition.

The probability of observing a specific root cause given the observed suspect list may be represented by $$c_{i,l}^{(t)} = P(RC_i = rc_l | S_{i,1} = s_{i,1}, S_{i,2} = s_{i,2}, \ldots, S_{i,j_i} = s_{i,j_i}, \theta^{(t)}) \quad [4]$$

This can be transformed using Bayes rule into an equation allowing direct computation by substituting the probability functions described above:

$$c_{i,l}^{(t)} = \frac{\prod_{j_i} \sum_{k_i} P(s_{i,j_i} = s_{i,j_i} | CS_i = s_{i,k_i}, RC_i = rc_l) \cdot P(CS_i = s_{i,k_i}) \cdot P(RC_i = rc_l | \theta^{(t)})}{\sum_l \prod_{j_i} \sum_{k_i} P(S_{i,j_i} = s_{i,j_i} | CS_i = s_{i,k_i}, RC_i = rc_l) \cdot P(CS_i = s_{i,k_i}) \cdot P(RC_i = rc_l | \theta^{(t)})} \quad [5]$$

$\theta_l$ may then be estimated by summing $c_{i,l}^{(t)}$ over all symptoms (including different dies) and $P(RC_i=rc_l|\theta)$ may be estimated based on $\theta_l$ and equation [1]:

$$\theta_l^{(t+1)} = \sum_i c_{i,l}^{(t)} \quad [6]$$

$$P(RC_i = rc_l | \theta^{(t+1)}) = \frac{\theta_l^{(t+1)}}{\sum_{m=1}^{L} \theta_m^{(t+1)}} \quad [7]$$

where the superscript (t) and (t+1) identify the variables associated with the current step and next step, respectively, during an iteration process.

Equations [5] [6] and [7] illustrate the circular dependence between the probability of observing a specific root cause and the probability distribution of root causes. This is why the expectation-maximization algorithm, an iteration process, can be used to derive the probability distribution of root causes.

Yield Analysis Tools and Methods

Figure 3:
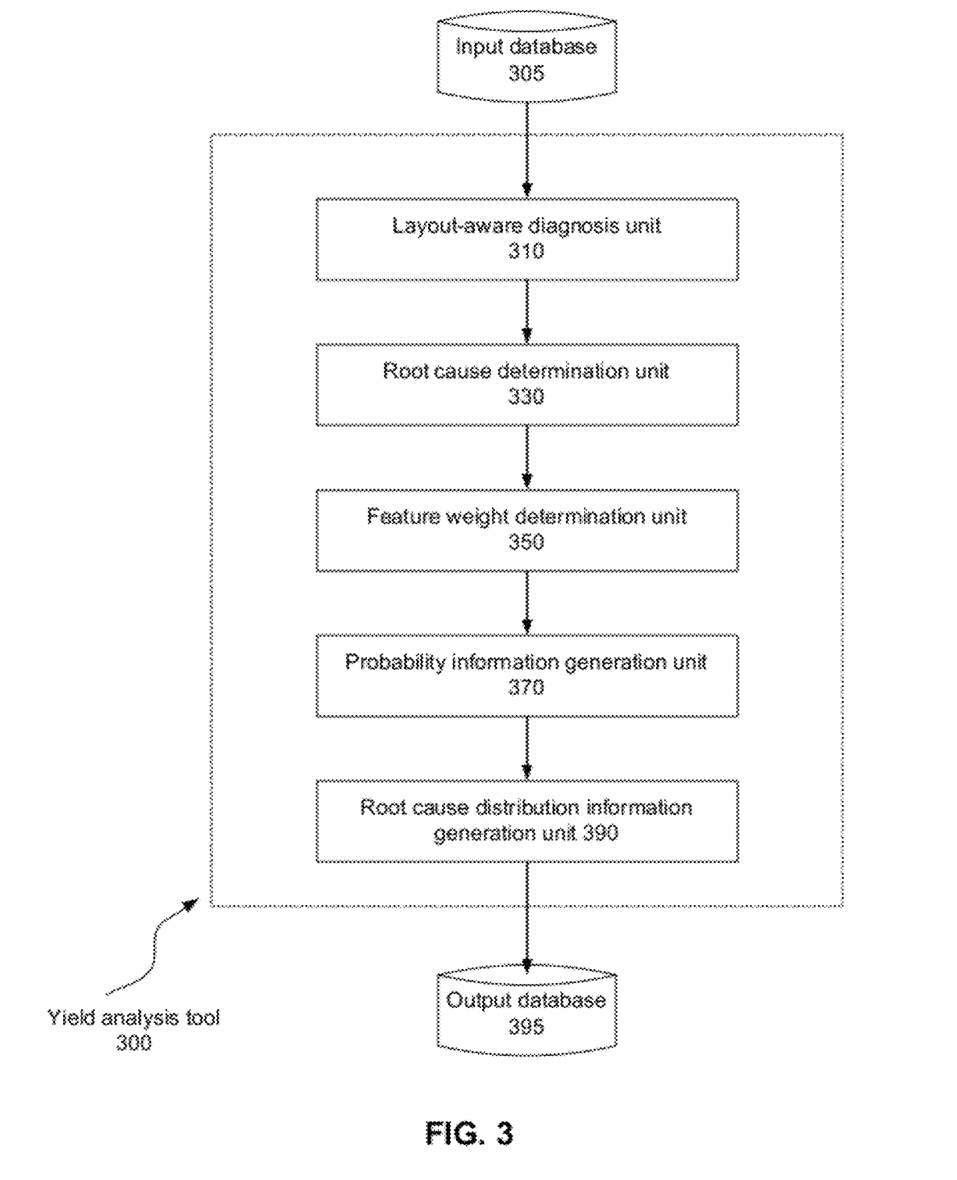
FIG. 3 illustrates an example of a yield analysis tool according to various embodiments of the invention.

FIG. 3 illustrates an example of a yield analysis tool according to various embodiments of the invention. As seen in the figure, the yield tool 300 includes six units: a layout-aware diagnosis unit 310, a root cause determination unit 330, a feature weight determination unit 350, a probability information generation unit 370 and a root cause distribution information generation unit 390. As will be discussed in more detail below, some implementations of the yield analysis tool 300 may cooperate with (or incorporate) one or both of an input database 305 and an output database 395. While the input database 305 and the output database 395 are shown as separate units in FIG. 3, a single data storage medium may be used to implement some or all of these databases.

According to some embodiments of the invention, one or more of the layout-aware diagnosis unit 310, the root cause determination unit 330, the feature weight determination unit 350, the probability information generation unit 370 and the root cause distribution information generation unit 390 may be implemented by executing programming instructions on one or more programmable computers/computer systems, such as the computing system illustrated in FIG. 1. Correspondingly, some other embodiments of the invention may be implemented by software instructions, stored on a non-transitory computer-readable medium, for instructing one or more programmable computers/computer systems to perform the functions of one or more of the layout-aware diagnosis unit 310, the root cause determination unit 330, the feature weight determination unit 350, the probability information generation unit 370 and the root cause distribution information generation unit 390. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device.

Figure 4:
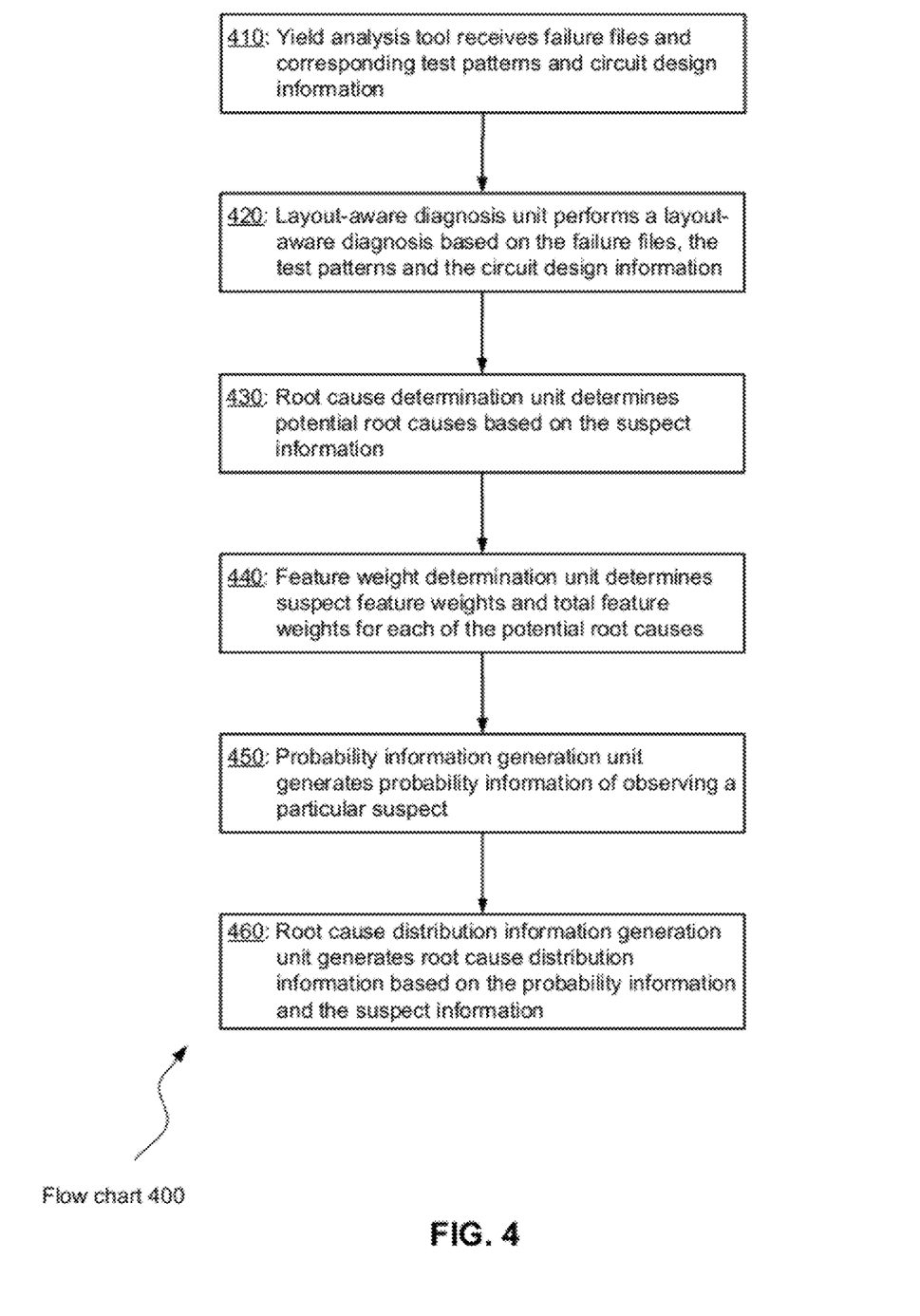
FIG. 4 illustrates a flowchart describing yield analysis methods that may be employed by various embodiments of the invention.

For ease of understanding, yield analysis methods that may be employed according to various embodiments of the invention will be described with reference to the yield analysis tool 300 illustrated in FIG. 3 and the flow chart 400 in FIG. 4. It should be appreciated, however, that alternate implementations of a yield analysis tool may be used to perform the yield analysis method shown in the flow chart 400 according to various embodiments of the invention. In addition, it should be appreciated that implementations of the yield analysis tool 300 may be employed with other yield analysis methods according to different embodiments of the invention.

Initially, in operation 410, the yield analysis tool 300 receives failure files and corresponding test patterns and circuit design information. The ATE may be used to produce the failure files for a plurality of failing dies. The failure files comprise test results for the test patterns. The circuit design information comprises logic and layout information. The logic information may be in the netlist form. In some embodiments of the invention, logic components in a netlist may be cross-referenced with geometric elements of a corresponding layout design.

Next, in operation 420, the layout-aware diagnosis unit 310 performs a layout-aware diagnosis based on the failure files, the test patterns and the circuit design information to derive suspect information for the plurality of failing dies. Various layout-aware diagnosis methods may be employed by the layout-aware diagnosis unit 310. The layout information may be used for filtering after a conventional logic-based diagnosis. The filtering operation can validate candidate suspects against physical possibilities based on the layout data. For example, among a group of nets that may explain an observed bridge fault, only a few of them can possibly form the bridge due to the routing of the nets.

The layout information can also be used at the earlier steps of a diagnosis. To illustrate it, the identification of an aggressor net for a dominant bridge is used as an example. For a dominant bridge, only one net (victim net) in a pair of nets (bridge suspect candidate) shows defective behavior while the other (aggressor net) does not. To identify aggressor net suspects, the layout-aware diagnosis unit 310 may first generate a list of neighboring net polygons in any unobstructed line-of-sight for all polygons of the victim net. Then the layout-aware diagnosis unit 310 may validate the list of physically possible neighbor nets against the logical possibilities.

In operation 430, the root cause determination unit 330 determines potential root causes for the plurality of failing dies based on the suspect information. With some implementations of the invention, three basic types of suspects may be produced by the layout-aware diagnosis unit 310: opens, bridges, and cell internal, corresponding to interconnect open defects, interconnect short defects and defects inside library cell boundaries, respectively. For an open suspect, the potential defect location may be a segment of a particular net. The defective net segment may be associated with potential root causes modeled as, for example, the metal open critical area for a particular metal layer and the via counts for each via type.

For a bridge suspect, the potential defect location may be a pair of nets that are considered electrically connected by a short defect. Suspects may be further classified as having a side-to-side, corner-to-corner or end-of-line configuration for consideration of some systematic effects in addition to random particle type defects. The potential root causes may be modeled as the metal short critical area for a particular metal layer. Cell internal suspects may be associated with root causes that are modeled with cell type counts.

In operation 440, the feature weight determination unit 350 determines suspect feature weights and total feature weights for each of the potential root causes. A suspect feature weight may be characterized by the total amount of physical feature for a root cause—the term $w_{j_i,l}$ in equation 3 is the amount of the physical feature for root cause l contained in the $i^{th}$ symptom and $j_i^{th}$ suspect. Depending upon the type of a root cause, the suspect feature weight may be determined, for example, by measuring relevant open/short critical area, via counts or cell type counts.

The total feature weight may be the total amount of the physical feature for root cause l contained within all possible suspects in the design. The determination of the total feature weight may comprise: a) Physical extraction of all possible suspects and their associated feature weights; b) determination of which potential suspect can actually show up as suspects when diagnosing scan failures; and c) summing up feature weights of those potential suspects that can show up as suspects when diagnosing scan failures.

A suspect can show up in a scan diagnosis report if it meets two criteria. First, the associated defect can be detected by the scan test pattern set applied. Because the defect behavior can be highly arbitrary and hard to pre-determine, heuristics based on multiple detection of stuck-at faults may be used to determine when a potential suspect is likely to be detected by the scan test. Second, the defect associated with a potential suspect should not be detected by any tests applied before the scan test. Typically, the main defects that fall into this category are those affecting proper operation of the scan chain. It should be noted that diagnosis of chain failures is possible, but produces significantly different suspects that are not currently being modeled for the statistical analysis described herein and may therefore be excluded.

In operation 450, the probability information generation unit 370 generates probability information of observing a particular suspect that is related to a particular root cause based on the suspect feature weights, the total feature weights, the suspect information and the circuit design information. With various implementations of the invention, the probability information generation unit 370 may employ equation 3 for this operation. The details have been discussed above.

In operation 460, the root cause distribution information generation unit 390 generates root cause distribution information based on the probability information and the suspect information. The root cause distribution information generation unit 390 may employ the expectation-maximization algorithm as illustrated by equations [5] [6] and [7]. The algorithm first makes up parameters for the root cause distribution information, and then performs an iteration process between an expectation step and a maximization step until convergence of these parameters. The expectation step calculates through the posterior probability of observing a specific root cause given the observed suspect list (equation [5]). In the maximization step, the maximum likelihood parameters are estimated from the expected frequencies of the missing data and the root cause probability distribution is updated (equations [6] and [7]).

The expectation-maximization algorithm may not find the global maximum likelihood parameters after completing the iteration process. The root cause distribution information generation unit 390 may use a random restart technique to overcome the problem. In this technique, the algorithm is repeated many times, each time starting from a random initial guess. For each initial guess and EM convergence, the final likelihood is computed. The final parameter values are chosen from the EM run that produced the highest likelihood.

There may also be an over-fitting problem. Most modern semiconductor devices are fabricated with a number of routing layers, a number of different types of via configurations, a number of different standard cell variants, and a very large number of possible layout geometries that can all be associated with a root cause. This may lead to hundreds or even thousands of possible root causes to be considered in the learning process. In addition, there will very often be fewer failing devices in a population of interest than the number of potential root causes. This may create a possibility that the learned model parameters will over fit the observations and not lead to a correct understanding of the real root cause distribution. The root cause distribution information generation unit 390 may prevent it from happening by adding a heuristic to limit the complexity of the learned model. In the maximization step, the calculation of the model parameters may be changed to the following:

$$\theta_l^{(t+1)} = \begin{cases} \sum_i c_{i,l}^{(t)} & \text{if } \sum_i c_{i,l}^{(t)} > \theta_{min} \\ 0 & \text{otherwise} \end{cases} \quad [8]$$

where $\theta_{min}$ is the minimum allowed value that any root cause parameter can be before it is eliminated from consideration. By setting $\theta_l$ to zero, it is effectively removed from consideration because it cannot recover from that value. This heuristic provides a mechanism to control the complexity and cross validation may be used to determine the value of $\theta_{min}$.

The cross validation divides the original population into two groups; a training group and a test group. The model parameters are learned using the EM algorithm outlined above on the training group. Then the likelihood of the test group is determined using the model parameters learned from the training group. The likelihood of the test group is a measure of how well the model can predict unseen data. The model parameters that have the best predictive capability will most accurately reflect the real root cause distribution. The cross validation is typically run with multiple learning and testing divisions groups to ensure model selection is not determined by a single division. This is referred to as n-fold cross validation.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. A method of yield analysis, comprising:
   receiving failure files for a plurality of failing dies, and corresponding test patterns and circuit design information, the circuit design information comprising logic and layout information;
   performing a layout-aware diagnosis based on the failure files, the test patterns and the circuit design information to derive suspect information for the plurality of failing dies, the suspect information comprising a plurality of suspects;
   determining potential root causes for the plurality of failing dies based on the suspect information;
   determining suspect feature weights and total feature weights for each of the potential root causes;
   generating probability information of observing a particular suspect that is related to a particular root cause based on the suspect feature weights, the total feature weights, the suspect information and the circuit design information; and
   generating root cause distribution information based on the probability information and the suspect information.

2. The method recited in claim 1, wherein the generating probability information comprises performing an expectation-maximization analysis.

3. The method recited in claim 2, wherein the performing expectation-maximization analysis comprises using heuristic information to eliminate one or more potential root causes.

4. The method recited in claim 2, wherein the performing expectation-maximization analysis comprises solving an over-fitting problem based on heuristic information.

5. The method recited in claim 1, wherein the suspects are arranged into symptoms.

6. The method recited in claim 1, wherein the suspect feature weights for open and bridge suspects are determined based, at least in part, on critical area determination.

7. A non-transitory computer-readable medium storing processor-executable instructions for causing one or more processors to perform a method of yield analysis, the method comprising:
   receiving failure files for a plurality of failing dies, and corresponding test patterns and circuit design information, the circuit design information comprising logic and layout information;
   performing a layout-aware diagnosis based on the failure files, the test patterns and the circuit design information to derive suspect information for the plurality of failing dies, the suspect information comprising a plurality of suspects;
   determining potential root causes for the plurality of failing dies based on the suspect information;
   determining suspect feature weights and total feature weights for each of the potential root causes;
   generating probability information of observing a particular suspect that is related to a particular root cause based on the suspect feature weights, the total feature weights, the suspect information and the circuit design information; and generating root cause distribution information based on the probability information and the suspect information.

8. The non-transitory computer-readable medium recited in claim 7, wherein the generating probability information comprises performing an expectation-maximization analysis.

9. The non-transitory computer-readable medium recited in claim 8, wherein the performing expectation-maximization analysis comprises using heuristic information to eliminate one or more potential root causes.

10. The non-transitory computer-readable medium recited in claim 8, wherein the performing expectation-maximization analysis comprises solving an over-fitting problem based on heuristic information.

11. A system comprising one or more processors, the one or more processors programmed to perform a method of yield analysis, the method comprising:

receiving failure files for a plurality of failing dies, and corresponding test patterns and circuit design information, the circuit design information comprising logic and layout information;

performing a layout-aware diagnosis based on the failure files, the test patterns and the circuit design information to derive suspect information for the plurality of failing dies, the suspect information comprising a plurality of suspects;

determining potential root causes for the plurality of failing dies based on the suspect information;

determining suspect feature weights and total feature weights for each of the potential root causes;

generating probability information of observing a particular suspect that is related to a particular root cause based on the suspect feature weights, the total feature weights, the suspect information and the circuit design information; and generating root cause distribution information based on the probability information and the suspect information.

12. The system recited in claim 11, wherein the generating probability information comprises performing an expectation-maximization analysis.

13. The system recited in claim 12, wherein the performing expectation-maximization analysis comprises using heuristic information to eliminate one or more potential root causes.

14. The system recited in claim 12, wherein the performing expectation-maximization analysis comprises solving an over-fitting problem based on heuristic information.

* * * * *